(12) United States Patent
El-Kik et al.

(10) Patent No.: US 6,184,807 B1
(45) Date of Patent: Feb. 6, 2001

(54) GLITCH-FREE BI-PHASED ENCODER

(75) Inventors: Tony S. El-Kik; Dennis A. Brooks, both of Allentown; Richard Muscavage, Gilbertsville, all of PA (US)

(73) Assignee: Lucent Technologies, Inc., Murray Hill, NJ (US)

( * ) Notice: Under 35 U.S.C. 154(b), the term of this patent shall be extended for 0 days.

(21) Appl. No.: 09/123,334

(22) Filed: Jul. 28, 1998

(51) Int. Cl.[7] .............................. H03M 7/12; H03K 5/01
(52) U.S. Cl. ........................ 341/70; 327/163; 327/166
(58) Field of Search ...................... 341/68–72; 375/360; 327/31, 35, 166, 107, 163

(56) References Cited

U.S. PATENT DOCUMENTS

| | | | |
|---|---|---|---|
| 4,204,199 | * 5/1980 | Isailovic | 341/68 |
| 4,307,381 | * 12/1981 | Isailovic | 341/68 |
| 4,325,053 | * 4/1982 | Le Brozec et al. | 341/68 |

\* cited by examiner

*Primary Examiner*—Peguy JeanPierre
(74) *Attorney, Agent, or Firm*—Baker & McKenzie

(57) ABSTRACT

An encoder which includes a flip-flop; a first, second and third NAND gate; a first and second inverter; and a first and second delay cell. The first inverter couples the flip-flop with the first NAND gate. The first delay cell couples the first NAND gate with the third NAND gate. The second inverter couples the second delay cell with the second NAND gate. Further, the second NAND gate couples the second inverter with the third NAND gate. The third NAND gate of the encoder produces a glitch-free encoded signal.

12 Claims, 4 Drawing Sheets

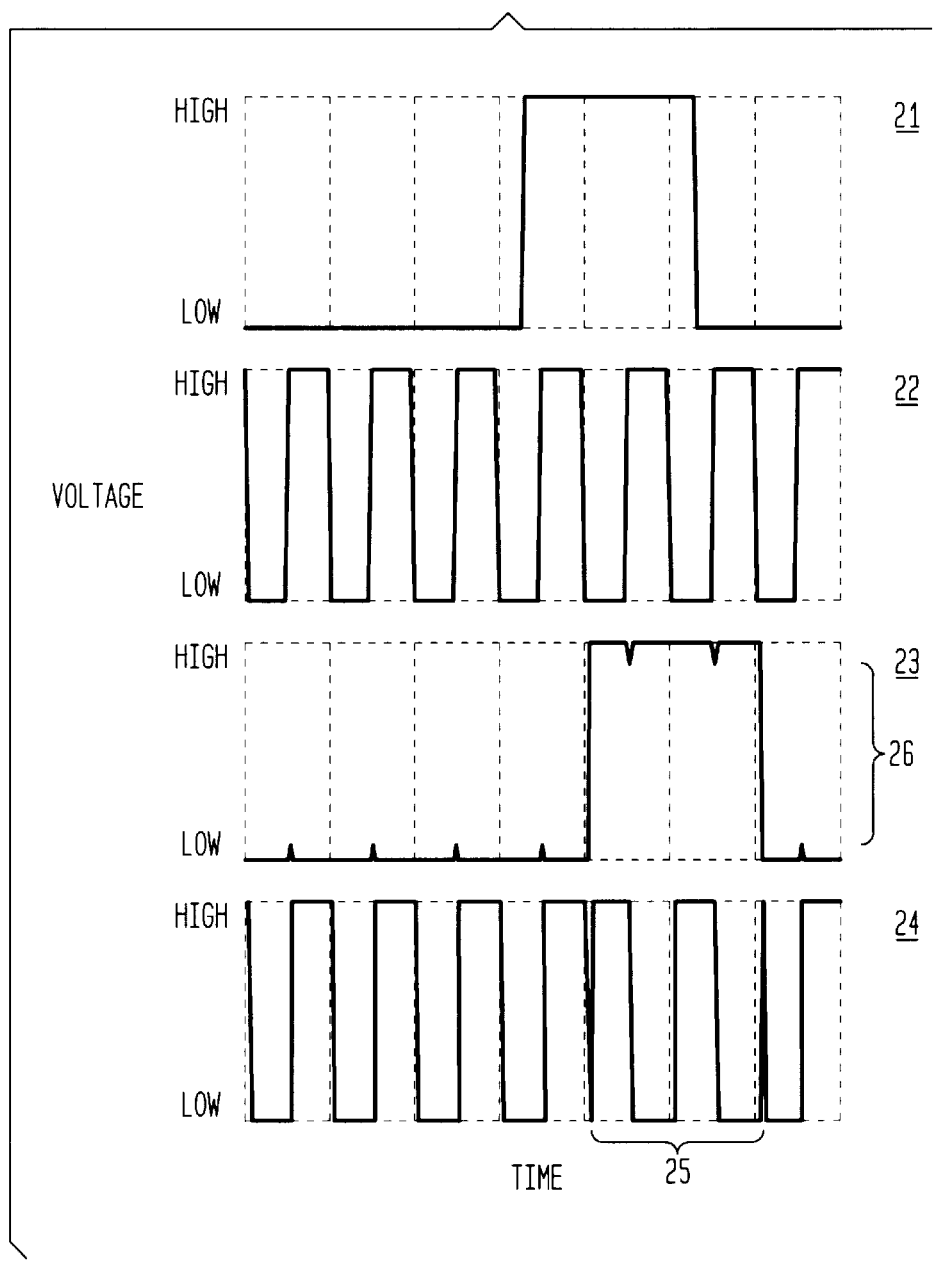

GLITCH-FREE BI-PHASED ENCODER

FIELD OF THE INVENTION

The present invention relates to the field of encoders, in particular to glitch-free bi-phased encoders.

BACKGROUND INFORMATION

Conventional bi-phased encoders 10, for example, as shown in FIG. 1, encode input signals such as data 21 and a clock signal 22 and provide an output signal 24, as shown in FIG. 2. The bi-phased encoder 10, as shown in FIG. 1, includes a flip-flop 11, an inverter 12, and an exclusive OR gate 13. Generally, the output signal 23 provided by the flip-flop 11 includes glitches 26. Moreover, the conventional bi-phased encoders 10 provide output signals 24 having glitches 25. For example, conventional bi-phased encoders 10 implemented to transfer clock information and data information on one line across a high voltage interface generate glitches 25 along with the output signal 24. The glitches 25 are created by the encoders 10 during data transitions between a high state and low state, as shown in FIG. 2. Accordingly, the respective decoders decode the signals improperly and provide erroneous data.

Although utilizing conventional bi-phased encoders to encode signals has generally been accepted, such encoders are prone to providing output signals having glitches and are not suitable for applications requiring high accuracy and reliability.

SUMMARY OF THE INVENTION

An object of the present invention is providing a clock deglitching circuit for preventing glitches on an encoded output signal.

Another object of the present invention is providing an encoder which produces an accurate encoded signal.

It is still another object of the present invention to provide a codec interface system which accurately encodes, transmits, and decodes data.

An aspect of the present invention provides an encoder which includes a flip-flop; a first, second and third NAND gate; a first and second inverter; and a first and second delay cell. The first inverter couples the flip-flop with the first NAND gate. The first delay cell couples the first NAND gate with the third NAND gate. The second inverter couples the second delay cell with the second NAND gate. Further, the second NAND gate couples the second inverter with the third NAND gate.

Another aspect of the present invention provides a clock deglitching circuit which includes a flip-flop; a first, second and third NAND gate; a first and second inverter; and a first and second delay cell. The first inverter couples the flip-flop with the first NAND gate. The first delay cell couples the first NAND gate with the third NAND gate. The second inverter couples the second delay cell with the second NAND gate. Further, the second NAND gate couples the second inverter with the third NAND gate. The third NAND gate of the encoder produces a glitch-free encoded signal.

Still another aspect of the present invention provides a Data Access Arrangement codec interface system which includes a transmitter codec communicating with a receiver codec. The transmitter codec includes a flip-flop; a first, second and third NAND gate; a first and second inverter; and a first and second delay cell. The first inverter couples the flip-flop with the first NAND gate. The first delay cell couples the first NAND gate with the third NAND gate. The second inverter couples the second delay cell with the second NAND gate. Further, the second NAND gate couples the second inverter with the third NAND gate. The third NAND gate of the transmitter codec of the codec interface system provides a glitch-free encoded signal to the receiver codec.

BRIEF DESCRIPTION OF THE DRAWINGS

FIG. 2 illustrates signal timing charts showing the status of signals of the bi-phased encoder of FIG. 1.

DETAILED DESCRIPTION

Figure 1:
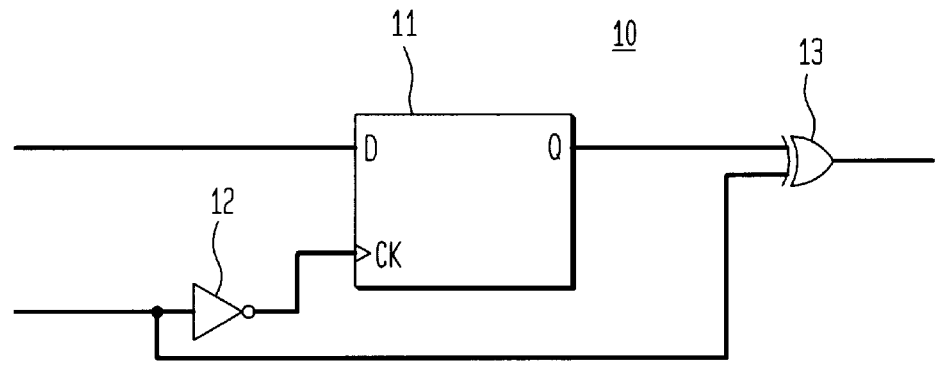
FIG. 1 shows a conventional bi-phased encoder.
Figure 3:
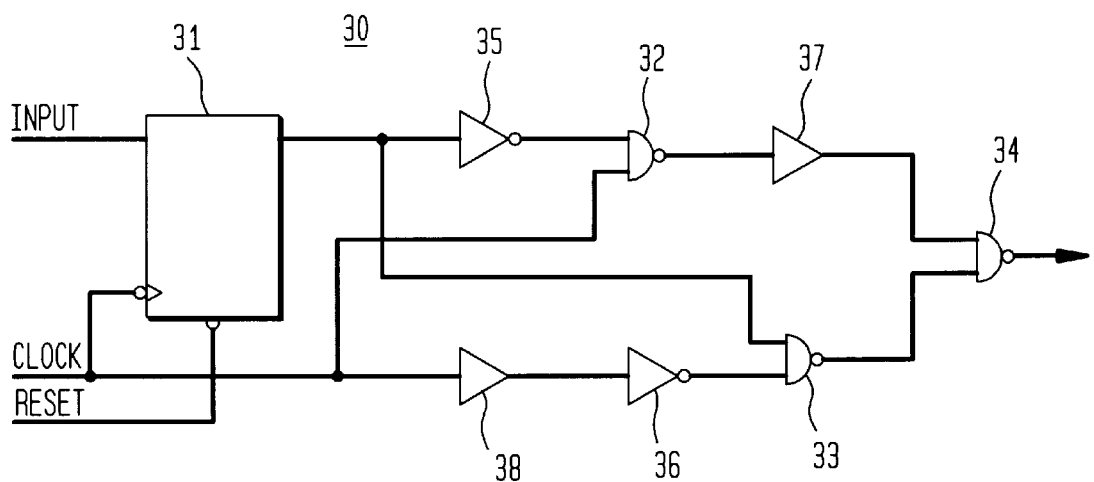
FIG. 3 shows an exemplary embodiment of a bi-phased encoder including a clock deglitching circuit of the present invention.

As shown in FIG. 3, an exemplary embodiment of the present invention includes an encoder 30 which includes a clock deglitching circuit. The clock deglitching circuit includes a flip-flop 31, a plurality of gates 32, 33, 34, and a plurality of delay cells 37, 38. In one embodiment of the present invention, as shown in FIG. 3, the gates may be NAND gate. The encoder 30 may also include a plurality of inverters. In an exemplary embodiment of an encoder of the present invention, the encoder may include, for example, a first NAND gate 32, a second NAND gate 33, a third NAND gate 34, a first delay cell 37, a second delay cell 38, a first inverter 35, and a second inverter 36. In this embodiment, the first inverter 35 couples the flip-flop 31 with the first NAND gate 32. The first delay cell 37 couples the first NAND gate 32 with the third NAND gate 34. The second inverter 36 couples the second delay cell 38 with the second NAND gate 33. Further, the second NAND gate 33 couples the second inverter 36 with the third NAND gate 34. In an embodiment of the present invention, the flip-flop 31 is an edge-triggered flip-flop and the encoder 30 is bi-phased.

Figure 4:
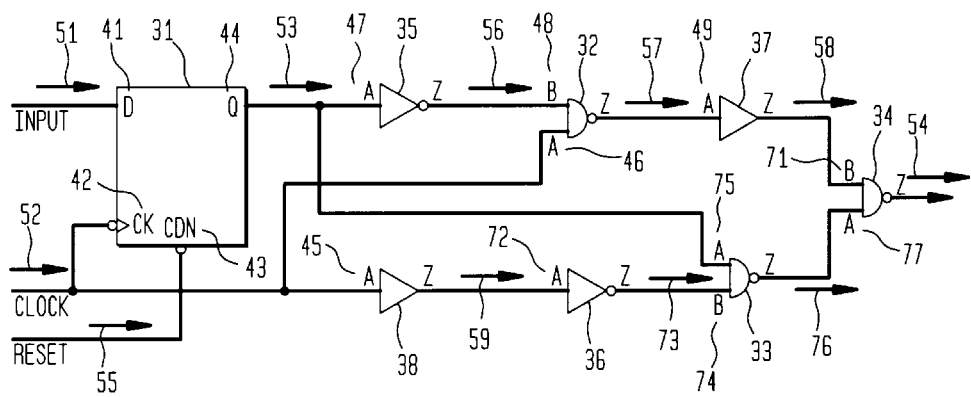
FIG. 4 shows an exemplary embodiment of a bi-phased encoder including a clock deglitching circuit of the present invention and signals provided therefrom.

In operation, an embodiment of the present invention, as shown in FIG. 4, the clock deglitching circuit includes a flip-flop 31 which receives data 51 at a data input 41, a clock signal 52 at a clock input 42, a reset signal 55 at a reset input 43, and an output 44. In an exemplary embodiment of the present invention, the clock input 42 and reset input 43 can be inverted. The flip-flop 31 provides an output signal 53 which may include, for example, clock information and data. The encoder 30, in one embodiment of the present invention, includes a clock signal 52 provided to the clock input 42 of flip-flop 31, an input 45 of the second delay cell 38, and a second input 46 of the first NAND gate 32.

As shown in FIG. 4, the first inverter 35 receives the output signal 53 from the flip-flop 31 at an input 47 and provides an output signal 56 to a first input 48 of the first NAND gate 32. A second input of the first NAND gate 46 also receives the clock signal 52. The first NAND gate 32 provides an output signal 57 to an input 49 of the first delay cell 37. The first delay cell 37 provides an output signal 58 to a first input 71 of the third NAND gate 34.

Referring to FIG. 4, the second delay cell 38 also receives the clock signal 52 at an input 45. The second delay cell 38 provides an output signal 59 to an input 72 of the second inverter 36. In one embodiment of the present invention, the amount of delay present on the output signal 58 of the first delay cell 37 is chosen, for example, to guarantee that the output signal 76 of the second NAND gate 33 has a chance to change state before the output signal 58 of the first delay cell 37. This presents a glitch on the output signal 54 of the third NAND gate 34. In similar fashion, the amount of delay present on the output signal 59 of the second delay cell 38 is chosen to guarantee that the output signal 53 of the flip-flop 31 has a chance to change state before the output signal 73 of the second inverter 36. This prevents a glitch on the output signal 76 of the second NAND gate 33 which would then propagate to the output signal 54 of the third NAND gate 34. Accordingly, the amount of delay is determined by the above-mentioned criteria. As shown in FIG. 4, the second inverter 36 provides an output signal 73 to a first input 74 of the second NAND gate 33. The second NAND gate 33 also receives the output signal 53 from the flip-flop 31 at a second input 75. The second NAND gate 33 provides an output signal 76 to a second input 77 of the third NAND gate 34.

Figure 5:
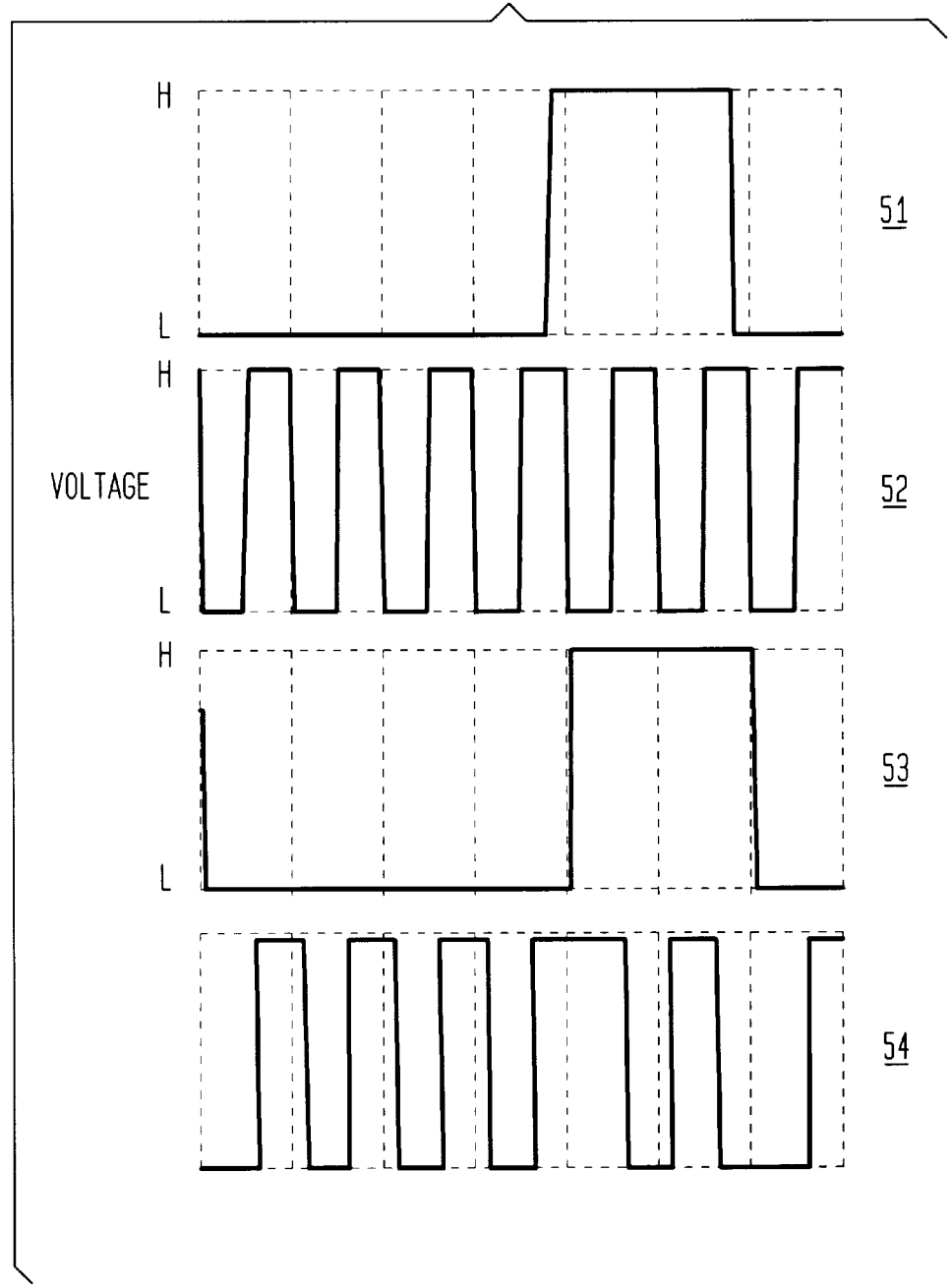
FIG. 5 illustrates signal timing charts showing the status of signals of an exemplary embodiment of the bi-phased encoder of FIG. 4.

The third NAND gate 34, as illustrated in FIG. 4, provides an output signal 54, for example, an encoded signal including data and clock information. Further, as shown in FIG. 5, the output signal 54 of the third NAND gate 34 is glitch-free. In an exemplary embodiment of the present invention, the third NAND gate 34 provides a glitch-free encoded signal to a decoder 64, for example, a bi-phased decoder.

Figure 6:
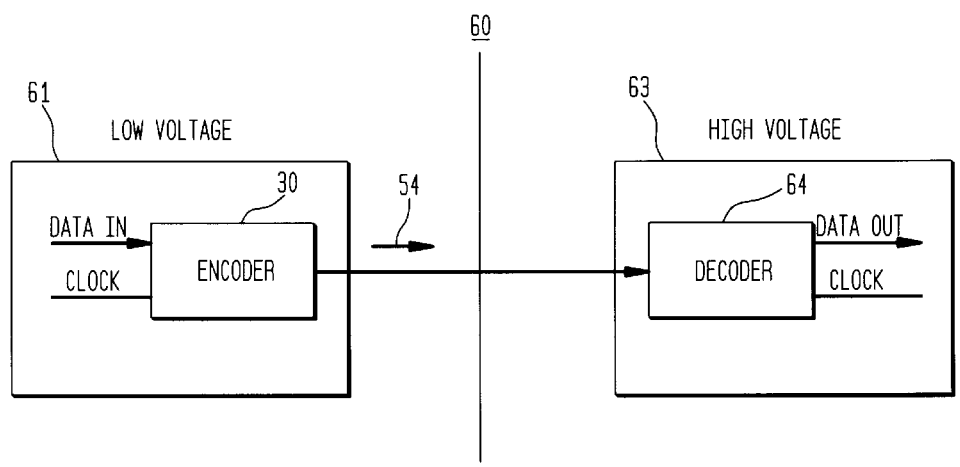
FIG. 6 shows an exemplary embodiment of a Data Access Arrangement codec interface system of the present invention.

In an exemplary embodiment of a Data Access Arrangement (hereinafter "DAA") codec interface system 60 of the present invention, as shown in FIG. 6, the DAA codec interface system 60 can include, for example, a transmitter codec 61 communicating with a receiver codec 63. The transmitter codec 61 can incorporate an encoder 30, such as a bi-phased encoder which may include the clock deglitching circuit as previously described. In this embodiment of the present invention, the third gate 34 can provide a glitch-free encoded signal 54 to the receiver codec 63. The receiver codec 63 can include a decoder 64 such as a bi-phased decoder. By providing a glitch-free output signal 54, the receiver codec 63 can decode the output signal 54 and separate the data and clock signal in an accurate and reliable manner. In an exemplary embodiment of the present invention, the transmitter codec 61 can operate in a low voltage environment and the receiver codec 63 can operate in a high voltage environment.

The embodiments described above are illustrative examples of the present invention and it should not be construed that the present invention is limited to these particular embodiments. Various changes and modifications may be effected by one skilled in the art without departing from the spirit or scope of the invention as defined in the appended claims.

What is claimed is:

1. A circuit comprising:

a flip-flop, the flip-flop receiving an input signal and a clock signal having clock information;

a first, second and third gate;

a first delay cell, the first delay cell allowing an output signal of the second gate to transition between a high and low state prior to providing a signal to the third gate;

a second delay cell, the second delay cell allowing an output signal of the flip-flop to transition between a low and high state prior to providing the second gate with the clock signal;

the first gate coupling the flip-flop with the first delay cell;

the first delay cell coupling the first gate with the third gate; and the second gate coupling the second delay cell with the third gate;

wherein the third gate provides an output signal including data and the clock information.

2. The circuit according to claim 1, wherein the first, second and third gates are NAND gates.

3. The circuit according to claims 1, further comprising a first and second inverter.

4. The circuit according to claim 3, wherein the first inverter couples the flip-flop with the first gate and the second inverter couples the second gate with the second delay cell.

5. The circuit according to claim 1, wherein the circuit is bi-phased.

6. The circuit according to claim 1, wherein the flip-flop is an edge-triggered flip-flop.

7. The circuit according to claim 1, wherein a clock signal is provided to the flip-flop, the second delay cell and the first gate.

8. The circuit according to claim 1, wherein the third gate provides a glitch-free encoded signal to a decoder.

9. A Data Access Arrangement codec interface system including a transmitter codec communication with a receiver codec, the transmitter codec comprising:

a flip-flop, the flip-flop receiving an input signal and a clock signal having clock information;

a first, second and third gate;

a first delay cell, the first delay cell allowing an output signal of the second gate to transition between a high and low state prior to providing a signal to the third gate;

a second delay cell, the second delay cell allowing an output signal of the flip-flop to transition between a low and high state prior to providing the second gate with the clock signal;

the first gate coupling the flip-flop with the first delay cell;

the first delay cell coupling the first gate with the third gate; and the second gate coupling the second delay cell with the third gate;

wherein the third gate provides a glitch-free output signal including data and the clock information to the receiver codec.

10. The Data Access Arrangement codec interface system according to claim 9, wherein the first, second and third gates are NAND gates.

11. The Data Access Arrangement codec interface system according to claim 9, further comprising a first and second inverter.

12. The Data Access Arrangement codec interface system according to claim 11, wherein the first inverter couples the flip-flop with the first gate and the second inverter couples the second gate with the second delay cell.

* * * * *